United States Patent
Li et al.

(10) Patent No.: US 11,362,167 B2
(45) Date of Patent: Jun. 14, 2022

(54) DISPLAY SUBSTRATE AND DISPLAY DEVICE

(71) Applicant: BOE Technology Group Co., Ltd., Beijing (CN)

(72) Inventors: Xin Li, Beijing (CN); Lujiang Huangfu, Beijing (CN); Xing Fan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1 day.

(21) Appl. No.: 16/913,319

(22) Filed: Jun. 26, 2020

(65) Prior Publication Data

US 2021/0013289 A1      Jan. 14, 2021

(30) Foreign Application Priority Data

Jul. 12, 2019   (CN) .......................... 201910631808.2

(51) Int. Cl.
*H01L 27/32*    (2006.01)
*G09G 3/3225*   (2016.01)
*H01L 27/12*    (2006.01)

(52) U.S. Cl.
CPC ....... *H01L 27/3276* (2013.01); *G09G 3/3225* (2013.01); *H01L 27/3262* (2013.01);
(Continued)

(58) Field of Classification Search
CPC ............. H01L 27/3276; H01L 27/3262; H01L 27/1255; H01L 27/3244; H01L 27/326;
(Continued)

(56) References Cited

U.S. PATENT DOCUMENTS

| 2012/0050344 A1* | 3/2012 | Kim | G09G 3/3233 345/690 |
| 2013/0222356 A1* | 8/2013 | Jeong | G09G 3/3233 345/211 |

(Continued)

FOREIGN PATENT DOCUMENTS

| CN | 1855201 A | 11/2006 |
| CN | 102157542 A | 8/2011 |

(Continued)

OTHER PUBLICATIONS

First Office Action dated Jan. 28, 2021 for application No. CN201910631808.2 with English translation attached.

(Continued)

*Primary Examiner* — Patrick N Edouard
*Assistant Examiner* — Douglas M Wilson
(74) *Attorney, Agent, or Firm* — Nath, Goldberg & Meyer; Joshua B. Goldberg

(57) ABSTRACT

The present disclosure provides a display substrate, including a substrate, a first power line on the substrate, a second power line, and a plurality of pixel groups, each of which includes a plurality of pixels arranged in a first direction, the plurality of pixel groups are arranged in a second direction parallel to an extending direction of the first power line, the second direction is different from and intersects with the first direction, each of the plurality of pixels includes a light emitting unit having a first electrode and a second electrode, the first electrode of the light emitting unit is coupled to the first power line through an additional resistor with an additional resistance, and the second electrode of the light emitting unit is coupled to the second power line through an equivalent resistor with an equivalent resistance.

19 Claims, 3 Drawing Sheets

(52) U.S. Cl.
CPC ............... *G09G 2300/0426* (2013.01); *G09G 2300/0809* (2013.01); *G09G 2300/0819* (2013.01); *G09G 2320/0233* (2013.01); *H01L 27/1255* (2013.01)

(58) Field of Classification Search
CPC ......... G09G 3/3225; G09G 2300/0809; G09G 2320/0233; G09G 3/3233; G09G 2300/0861; G09G 2300/0819; G09G 2300/0842; G09G 2300/0426
See application file for complete search history.

(56) References Cited

U.S. PATENT DOCUMENTS

| | | | |
|---|---|---|---|
| 2014/0240305 A1* | 8/2014 | Chae | G09G 3/3225 345/212 |
| 2020/0273940 A1* | 8/2020 | Byun | H01L 27/3276 |
| 2021/0210585 A1* | 7/2021 | Lee | H01L 27/3276 |

FOREIGN PATENT DOCUMENTS

| | | |
|---|---|---|
| CN | 102483896 A | 5/2012 |
| CN | 102708819 A | 10/2012 |
| CN | 104064686 A | 9/2014 |
| CN | 104091818 A | 10/2014 |
| CN | 104464621 A | 3/2015 |
| CN | 105742312 A | 7/2016 |
| CN | 107611164 A | 1/2018 |
| CN | 107819022 A | 3/2018 |
| CN | 108022964 A | 5/2018 |
| CN | 207303105 U | 5/2018 |
| CN | 207320119 U | 5/2018 |
| CN | 108258148 A | 7/2018 |
| CN | 109671747 A | 4/2019 |

OTHER PUBLICATIONS

Office Action dated Jul. 14, 2021 for application No. CN201910631808.2 with English translation attached.

* cited by examiner

DISPLAY SUBSTRATE AND DISPLAY DEVICE

CROSS-REFERENCE TO RELATED APPLICATION

The present disclosure claims priority from the Chinese patent application No. 201910631808.2, filed on Jul. 12, 2019, the disclosure of which is hereby incorporated herein by reference in its entirety.

TECHNICAL FIELD

The present disclosure relates to the technical field of display, and in particular to a display substrate and a display device.

BACKGROUND

In the related art, an organic light emitting diode (OLED) device is generally provided with a top emission structure, and a relatively thin metal electrode is generally used as a semitransparent cathode.

SUMMARY

The present disclosure provides a display substrate, including a substrate, a first power line on the substrate, a second power line, and a plurality of pixel groups, and each of the plurality of pixel groups includes a plurality of pixels arranged in a first direction, the plurality of pixel groups are arranged in a second direction parallel to an extending direction of the first power line, the second direction is different from and intersects with the first direction, each of the plurality of pixels includes a light emitting unit having a first electrode and a second electrode, the first electrode of the light emitting unit is coupled to the first power line through an additional resistor with an additional resistance, and the second electrode of the light emitting unit is coupled to the second power line through an equivalent resistor with an equivalent resistance, and the plurality of pixels in a same pixel group have substantially a same sum of the equivalent resistance and the additional resistance.

In some embodiments, each of the plurality of pixels further includes a pixel driving circuit for driving the light emitting unit to emit light, and the pixel driving circuit includes a first capacitor, a driving transistor and a light emitting control transistor, and a gate of the driving transistor is coupled to a first electrode of the first capacitor, a second electrode of the first capacitor is coupled to a data line, a first electrode of the driving transistor is coupled to the first power line through the additional resistor, a second electrode of the driving transistor is coupled to a first electrode of the light emitting control transistor, a second electrode of the light emitting control transistor is coupled to the first electrode of the light emitting unit, and a gate of the light emitting control transistor is coupled to a light emitting control signal line.

In some embodiments, the second power line includes a first sub-power line and a second sub-power line respectively provided at both sides of each of the plurality of pixel groups.

In some embodiments, the first power line is provided between the first sub-power line and the second sub-power line, and an orthographical projection of the first power line on the substrate is substantially located at a bisector of an orthographical projection of the plurality of pixel groups on the substrate.

In some embodiments, the additional resistors of the plurality of pixels in the same pixel group are formed as a connection line continuously extending in the first direction.

In some embodiments, in the same pixel group, the equivalent resistance increases while the additional resistance decreases as a distance between a pixel and the first power line becomes shorter.

In some embodiments, the first sub-power line is coupled to corresponding equivalent resistors through a plurality of first signal lines, respectively; and the second sub-power line is coupled to corresponding equivalent resistors through a plurality of second signal lines, respectively.

In some embodiments, the second electrodes of the light emitting units of all pixels of the plurality of pixel groups form a second electrode layer which is continuous, and a surface resistance of the connection line is the same as a surface resistance of the second electrode layer.

In some embodiments, the first power line is provided at one side of the plurality of pixel groups, and the second power line is provided at the other side, which is opposite to the one side, of the plurality of pixel groups.

In some embodiments, the additional resistors of all pixels of the plurality of pixel groups are formed to have a planar-shaped structure which is continuous.

In some embodiments, in a same pixel group, the equivalent resistance increases while the additional resistance decreases as a distance between a pixel and the first power line becomes shorter.

In some embodiments, the first power line is coupled to corresponding additional resistors through a plurality of third signal lines, respectively; and the second power line is coupled to corresponding equivalent resistors through a plurality of fourth signal lines, respectively.

In some embodiments, the driving transistor is provided on the substrate, and the additional resistor is provided between the driving transistor and the substrate.

In some embodiments, the display substrate further includes an insulating layer disposed between the additional resistor and an active layer of the driving transistor, and the first electrode of the driving transistor penetrates through the insulating layer through a via hole therein to be in contact with the additional resistor.

In some embodiments, among the plurality of pixel groups, the driving transistors in a same pixel group are coupled to a same connection line, and the additional resistor is made of a transparent conductive material.

In some embodiments, the driving transistor of each of the plurality of pixels is coupled to the planar-shaped structure.

In some embodiments, the plurality of first signal lines and the plurality of second signal lines are made of a light-opaque metal material.

In some embodiments, the plurality of third signal lines and the plurality of fourth signal lines are made of a light-opaque metal material In some embodiments, each of the plurality of pixels further includes a pixel driving circuit for driving a light emitting unit to emit light, the pixel driving circuit including a driving transistor, a second capacitor, and a third transistor, and a first electrode of the driving transistor is coupled to a first power line through the additional resistor, a second electrode of the driving transistor is coupled to a first electrode of the light emitting unit, a gate of the driving transistor is coupled to a first electrode of the second capacitor and a first electrode of the third transistor, a second electrode of the second capacitor is coupled to the first electrode of the driving transistor, a second electrode of the third transistor is coupled to a data line, and a gate of the third transistor is coupled to a light emitting control signal line.

The present disclosure further provides a display device including the display substrate above.

BRIEF DESCRIPTION OF THE DRAWINGS

The accompanying drawings are provided for further understanding of the present disclosure and constitute a part of the specification, to illustrate the present disclosure together with the following embodiments, but do not constitute a limitation of the disclosure. In the drawings.

DETAILED DESCRIPTION

The embodiments of the present disclosure will be described in detail below with reference to the drawings. It should be understood that the embodiments described herein are only used to illustrate and explain the present disclosure, and are not intended to limit the present disclosure.

In an OLED display device with a top emission structure, in order to ensure transmittance of a cathode, the cathode needs to be provided with a small thickness. In general, the cathode of a light emitting unit is made of a metal with a small thickness, but this will result in a large resistance of the cathode. Thus, in a large-sized organic electroluminescent display panel, voltage attenuation (IR drop) occurs at the layer of the cathode, resulting in non-uniform display luminance of the display panel. In this display device, driving voltages for pixels are provided by a high-level input terminal and a low-level input terminal, and cathodes of a plurality of light emitting units in the display device are often formed as a continuous film. Thus, the closer to the low-level input terminal, the smaller an equivalent resistance between the cathode of a corresponding light emitting unit and the low-level input terminal; the further from the low level input terminal, the larger an equivalent resistance between the cathode of a corresponding light emitting unit and the low-level input terminal, and this difference in resistance is the main reason for the voltage drop (i.e., IR-drop) in the display device. This results in different voltages for different light emitting units, which results in difference in driving current in different regions of the display panel, and thus causes non-uniform display luminance.

Figure 1:
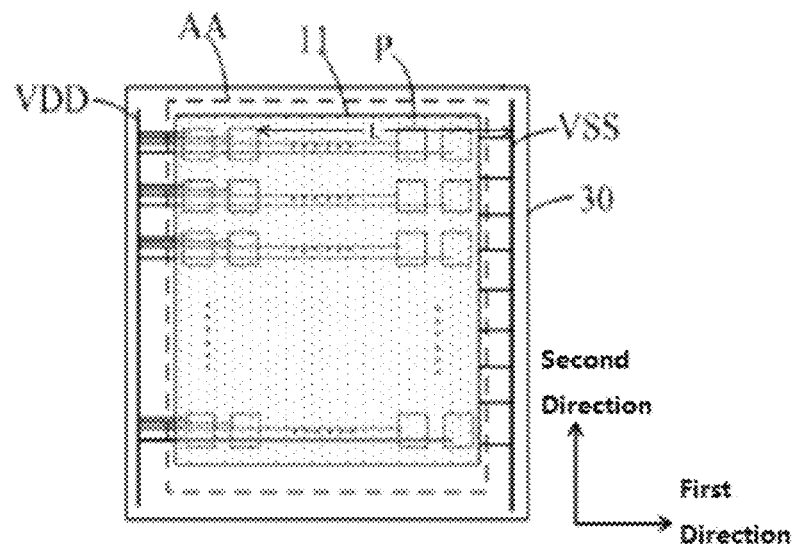
FIG. 1 is a schematic structural diagram of a display substrate according to an embodiment of the disclosure.
Figure 2:
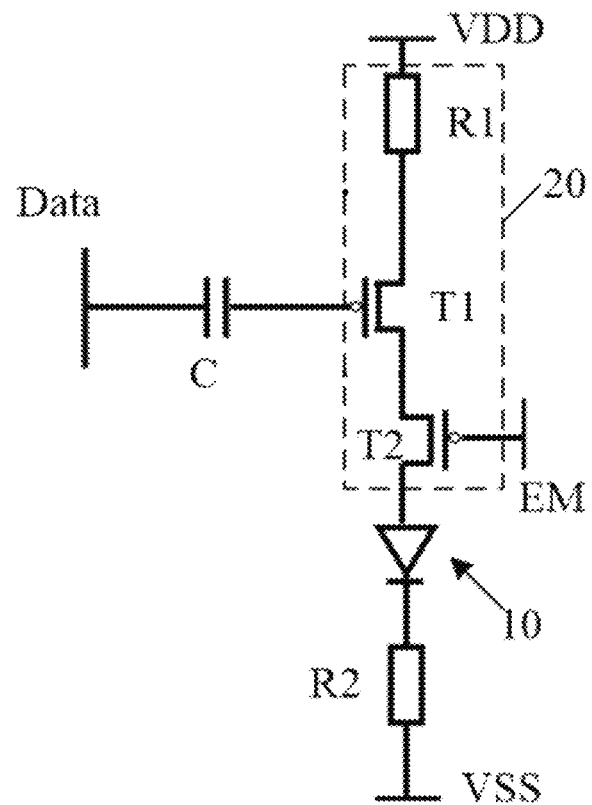
FIG. 2 is a schematic diagram of an equivalent circuit of each pixel in accordance with an embodiment of the present disclosure.

To solve this problem, embodiments of the present disclosure provide a display substrate. FIG. 1 is a schematic structural diagram of a display substrate according to an embodiment of the present disclosure. FIG. 2 is a schematic diagram of an equivalent circuit of each pixel in accordance with an embodiment of the present disclosure. As shown in FIG. 1 and FIG. 2, the display substrate includes a display region AA, and the display region AA includes a plurality of pixels P, and the plurality of pixels P are arranged in an array. A light emitting unit 10 is disposed in each pixel P and includes a first electrode and a second electrode. The first electrode of the light emitting unit 10 is coupled to a first power line VDD through a connection structure 20, and the second electrode of the light emitting unit 10 is coupled to a second power line VSS. A resistance between the first electrode of the light emitting unit 10 and the first power line VDD decreases as a shortest distance from the light emitting unit 10 to the second power line VSS increases, and a resistance between the second electrode of the light emitting unit 10 and the second power line VSS increases as the shortest distance from the light emitting unit 10 to the second power line VSS increases.

In the present disclosure, as an example, the first power line VDD is a high-level power line for providing a high-level signal, and the second power line VSS is a low-level power line for providing a low-level signal. Accordingly, the first electrode of the light emitting unit 10 is an anode, and the second electrode of the light emitting unit 10 is a cathode. The second electrodes of all the light emitting units 10 may be coupled together to form a second electrode layer 11 in a continuous manner. Thus, in all pixels, the greater the distance L (as shown in FIG. 1) from the light emitting unit 10 to the second power line VSS in a first direction substantially parallel to a row direction of a pixel array, the greater an equivalent resistance (corresponding to an equivalent resistor, which is schematically shown as a second resistor R2 with a second resistance in FIG. 2) between the cathode of the light emitting unit 10 and the second power line VSS.

In embodiments of the present disclosure, a connection portion is provided between the anode of the light emitting unit 10 and the first power line VDD, and the connection portion (which may be regarded as an additional resistor with an additional resistance) is schematically shown as a first resistor R1 with a first resistance in FIG. 2. The connection portion is configured such that as for the light emitting units 10 in a same row, a changing trend of the first resistance of the first resistor R1 with respect to the distance L is opposite to a changing trend of the second resistance of the second resistor R2 with respect to the distance L (i.e., the second resistance of the second resistor R2 increases as the distance L increases, while a first resistance of a corresponding first resistor R1 decreases as the distance L increases), and difference in the sums, for respective light emitting units, of the first resistance of the first resistor R1 and a corresponding equivalent resistance may be reduced (e.g., the sums, for respective light emitting units, of the corresponding additional resistance and the corresponding equivalent resistance may be the same, that is, the difference between the sums may be reduced to 0). Therefore, difference in voltages resulting from different equivalent resistances between different light emitting units 10 and the second power line VSS may be compensated, so that difference in resistance of circuit branches provided with respective light emitting units in different pixels may be reduced or even eliminated, thereby reducing difference in current received by the light emitting units in different pixels, and uniformity of display luminance may be improved.

In the embodiment of the present disclosure, the second power line VSS is disposed in a non-display region around the display region AA, the second power line VSS is provided at at least one side of the display region AA, and the second power line VSS is coupled to an end of the second electrode layer 11 through a plurality of signal lines.

Figure 3:
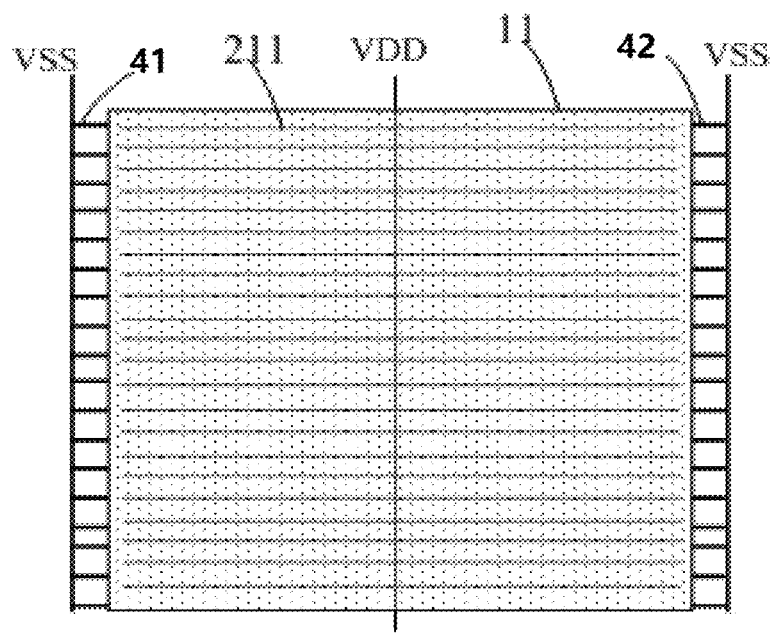
FIG. 3 is a schematic diagram illustrating how to arrange first and second power lines according to an embodiment of the disclosure.
Figure 4:
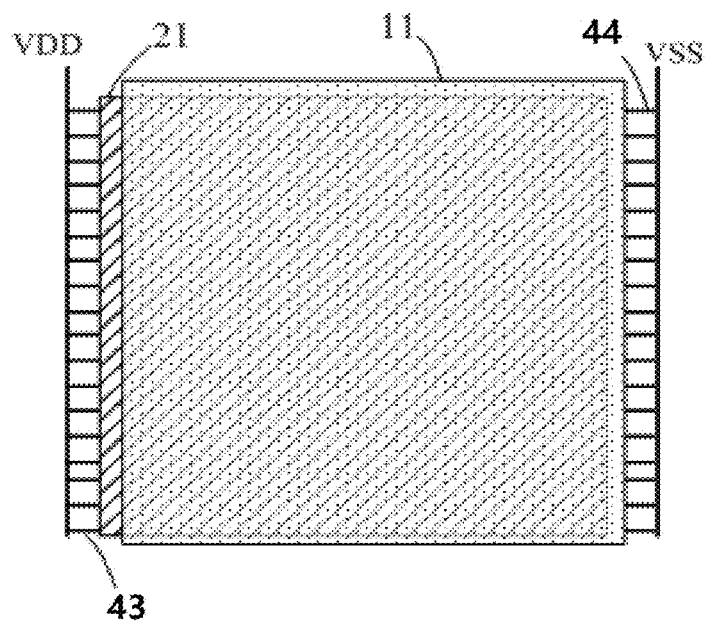
FIG. 4 is a schematic diagram illustrating how to arrange first and second power lines according to an embodiment of the disclosure.
Figure 5:
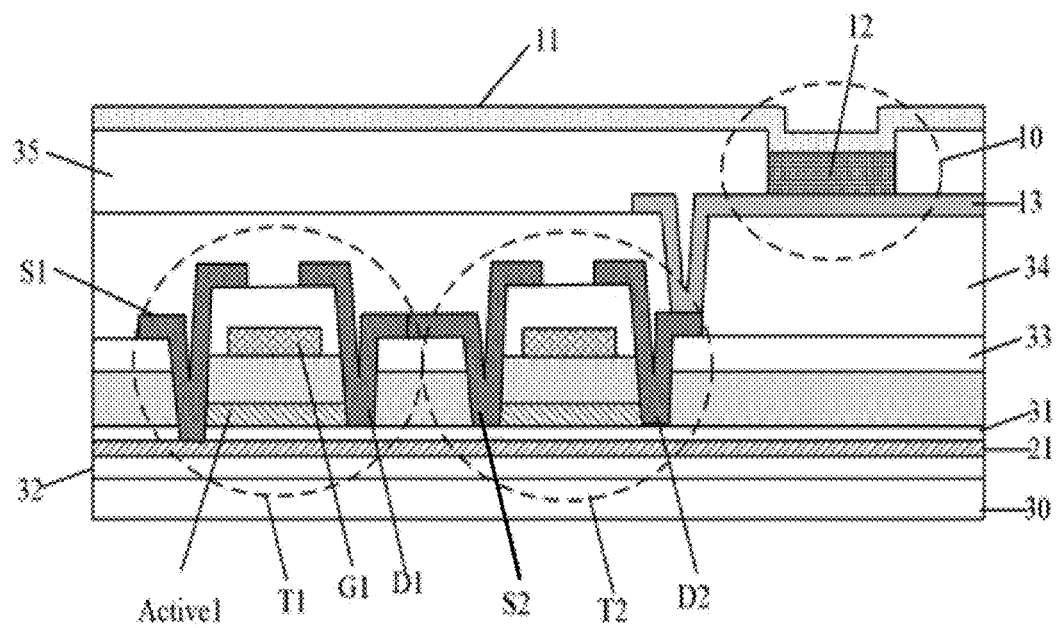
FIG. 5 is a schematic diagram of various layers in each pixel according to an embodiment of the disclosure.

FIG. 3 is a schematic diagram illustrating how to arrange first and second power lines according to an embodiment of the disclosure. FIG. 4 is a schematic diagram illustrating how to arrange first and second power lines according to an embodiment of the disclosure. FIG. 5 is a schematic diagram of various layers in each pixel according to an embodiment of the disclosure. The display substrate according to the embodiment of the present disclosure is described below with reference to FIG. 1 to FIG. 5.

According to an embodiment of the present disclosure, as shown in FIG. 3, the second power line VSS is disposed at both sides of the display region AA in the first direction, and the first power line VDD is disposed in the display region AA and has a same distance to both second power lines VSS. The first power line VDD and the second power line VSS both extend in a second direction, and the first direction crosses the second direction. For example, the first direction may be a row direction of the pixel array, and the second direction may be a column direction of the pixel array. A voltage on the second power line VSS is sequentially supplied to each column of pixels in a direction from both sides to the middle of the pixel array, and a voltage on the first power line VDD is sequentially supplied to each column of pixels from the middle to both sides of the pixel array. In the case where the second power lines VSS is disposed on both sides of the display region AA, the distance L between a light emitting unit 10 and a second power line VSS is the distance from the light emitting unit 10 to one of the two second power lines VSS which is closer to the light emitting unit 10 in the first direction. In this case, the connection portion is provided between the anode of the light emitting unit 10 and the first power lines VDD, such that as for the light emitting units 10 in a same row the changing trend of the first resistance of the first resistor R1 with respect to the distance L is opposite to the changing trend of the second resistance of the second resistor R2 with respect to the distance L, and the difference in sums, for respective light emitting units, of the first resistance of the first resistor R1 and the corresponding equivalent resistance may be reduced. Therefore, difference in voltages resulting from different equivalent resistances between different light emitting units 10 and the second power line VSS may be compensated, so that difference in resistance of the circuit branches provided with the light emitting units in different pixels may be reduced or even eliminated, thereby reducing difference in current received by the light emitting units in different pixels (e.g., the sums, for respective light emitting units, of the additional resistance and equivalent resistance may be the same, that is, the difference between the sums may be reduced to 0), and the uniformity of display luminance is improved. The second power line may include two lines: a first sub-power line and a second sub-power line, which are disposed at both sides of the display region, respectively and applied with a same voltage.

According to another embodiment of the present disclosure, as shown in FIG. 4, the first power line VDD and the second power line VSS are respectively disposed at two sides of the display region AA in the first direction, both of the first power line VDD and the second power line VSS extend in the second direction, the first direction crosses the second direction, a voltage on the first power line VDD is sequentially supplied to each column of pixels in a direction from left side to right side of the pixel array, and a voltage on the second power line VSS is sequentially supplied to each column of pixels in a direction from right side to left side of the pixel array. In the case where the first power line VDD and the second power line VSS are respectively disposed at two sides of the display region AA in the first direction, the distance L between the light emitting unit 10 and the second power line VSS is the distance from the light emitting unit 10 to the second power line VSS in the first direction. In this case, the connection portion is provided between the anode of the light emitting unit 10 and the first power lines VDD, such that as for the light emitting units 10 in a same row, the changing trend of the first resistance of the first resistor R1 with respect to the distance L is opposite to the changing trend of the second resistance of the second resistor R2 with respect to the distance L, and the difference in sums, for respective light emitting units, of the first resistance of the first resistor R1 and the corresponding equivalent resistance may be reduced. Therefore, difference in voltages resulting from different equivalent resistances between different light emitting units 10 and the second power line VSS may be compensated, so that in different pixels, difference in resistance of the circuit branches provided with the light emitting units may be reduced or even eliminated, thereby reducing difference in current received by the light emitting units in different pixels (e.g., the sums, for respective light emitting units, of the additional resistance and equivalent resistance may be the same, that is, the difference between the sums may be reduced to 0), and the uniformity of display luminance is improved.

In the embodiment of the present disclosure, the connection structure 20 and the light emitting unit 10 are both provided on a substrate 30. The connection structure 20 may include: a driving transistor T1, a light emitting control transistor T2, and a connection portion 21. The connection portion 21 may be equivalent to the first resistor R1 in a circuit (see FIG. 2). As shown in FIG. 2 and FIG. 5, the driving transistor T1 and the light emitting control transistor T2 are provided in each pixel. A first electrode S1 of the driving transistor T1 is coupled to the first power line through the connection portion 21, a second electrode D1 of the driving transistor T1 is coupled to a first electrode S2 of the light emitting control transistor T2, a second electrode D2 of the light emitting control transistor T2 is connected to the first electrode 13 of the g light emitting unit 10, and a gate of the light emitting control transistor T2 is connected to a light emitting control signal line EM. In the pixel, the additional resistance (i.e., the first resistance) between the first electrode S1 of the driving transistor T1 and the first power line VDD decreases as the shortest distance from the corresponding light emitting unit 10 to the second power line VSS increases. In the present disclosure, the "first electrode" of each transistor refers to a source of the transistor, and the "second electrode" specifically refers to a drain of the transistor. Of course, one skilled in the art will recognize that the "first electrode" and "second electrode" may be interchanged.

In addition, a capacitor C and a write transistor (not shown) may be further provided in each pixel, and both ends of the capacitor C are coupled to a data line Data and a gate of the driving transistor T1, respectively. The capacitor C, the driving transistor T1, the write transistor, and the light emitting control transistor T2 constitute a pixel driving circuit which can provide a corresponding driving current to the light emitting unit 10 according to the magnitude of a data signal on the data line Data when a scan signal (a light emitting control signal) is provided by a corresponding gate line.

Since the additional resistance (i.e., the first resistance) between the first electrode S1 of the driving transistor T1 and the first power line VDD decreases as the distance from the corresponding light emitting unit 10 to the second power line VSS increases, the farther a pixel is from the second power line VSS, the greater the equivalent resistance(i.e., the second resistance of the second resistor R2 connected in series) between the second electrode of the light-emitting unit 10 of the pixel and the second power line VSS, and the smaller the additional resistance (i.e., the first resistance of the first resistor R1 connected in series) between the first electrode of the driving transistor T1 and the first power line VDD; while the closer a pixel is to the second power line VSS, the smaller the equivalent resistance(i.e., the second resistance of the second resistor R2 connected in series) between the second electrode of the light-emitting unit 10 of the pixel and the second power line VSS, and the greater the additional resistance (i.e., the first resistance of the first resistor R1 connected in series) between the first electrode of the driving transistor T1 and the first power line VDD. So that in different pixels at different positions, difference in resistance of circuit branches provided with light emitting units may be minimized, the voltages on the light emitting units 10 of the different pixels are similar or the same, thus the driving current of the light emitting units 10 at different positions are similar or the same.

Specifically, the surface resistance (i.e., the surface resistance $R=\rho/D$, $\rho$ is the resistivity of the material to be measured, and D is the thickness of the material to be measured) of the connection portion 21 may be provided to be the same as the surface resistance of the second electrode layer 11, so that the farther the light emitting unit 10 is from the corresponding second power line VSS, the greater the equivalent resistance (i.e., the second resistance of the second resistor R2 connected in series) between the second electrode of the light emitting unit 10 and the corresponding second power line VSS, and the smaller the additional resistance (i.e., the first resistance of the first resistor R1 connected in series) between the first electrode S1 of the driving transistor T1 and the first power line VDD, and the absolute values of respective variations of the two resistances are substantially the same, thereby ensuring that in different pixels, the resistances of circuit branches each provided with a light emitting unit are substantially the same, and the uniformity of the display luminance may be improved.

In production, the surface resistances of the second electrode layer 11 and the connection portion 21 can be provided to be matched with each other by seleting the material and thickness of the second electrode layer 11 and the material and thickness of the connection portion 21. For example, the connection portion 21 may be made of a transparent conductive material such as indium tin oxide (ITO) to improve the light transmittance of the display region AA. In one embodiment, the thickness of the connection portion 21 may be 400 nm, and the surface resistance may be 10 Ω/sq.

In the embodiment of the present disclosure, the plurality of pixels in the display region may be divided into a plurality of groups, each group including at least one pixel. For example, each group includes a plurality of pixels located in a same row. In one embodiment, the connection portion 21 may include a plurality of connection lines 211, the driving transistors T1 of the pixels in a same group (or a same row) are connected to a same connection line 211, and the driving transistors T1 of the pixels in different groups (or different rows) are connected to different connection lines 211. As an example, the arrangement of the first power line VDD provided in middle of the display region and the second power line VSS provided at two sides (which are opposite to each other) of the display region is shown in FIG. 3 to illustrate how the compensation is performed when the connection portion includes a plurality of connection lines 211. With the first power line VDD as a center, in the pixels of the same group (or the same row), the second resistance of the second resistor R2 gradually increases from the two sides of the display region to the center, that is, the second resistance of the second resistor R2 increases as the distance L (i.e., the distance from the light emitting unit 10 to a closer one of the two second power line VSS in the first direction) increases. In this case, the connection portion 21 is configured such that, in the pixels of the same group (or the same row), the first resistance (of the first resistor R1) of the connection line 211 gradually decreases from the two sides of the display region to the center, i.e., the first resistance of the first resistor R1 decreases as the distance L increases, so that the sum of the first resistance of the first resistor R1 and the second resistance of the second resistor R2 of each pixel in the same group (or the same row) is substantially the same, thereby improving the uniformity of the display luminance.

In another embodiment, the connection portion 21 may be a continuous film to which all the driving transistors T1 are connected as shown in FIG. 4. In this way, in FIG. 4, in the pixels in the same row, as the distance L between the light emitting unit 10 and the second power line VSS increases, the equivalent resistance (i.e., the second resistance of the second resistor R2) of the corresponding light emitting unit 10 increases. In this case, the connection portion 21 is configured such that, in the pixels in the same row, as the distance L increases, the additional resistance (i.e., the first resistance of the first resistor R1) between the first electrode S1 of the driving transistor T1 and the first power line VDD decreases, the sum of the first resistance of the first resistor R1 and the second resistance of the second resistor R2 of each pixel in the same group (or the same row) is substantially the same, thereby improving the uniformity of the display luminance.

It should be noted that the arrangement of the first power lines VDD and second power lines VSS, and the connection portion 21 are not limited to the embodiments described herein, and those skilled in the art may make any modification without departing from the spirit of the present disclosure. For example, in the case where the first power line VDD is arranged in middle of the display region and the second power line VSS is arranged at both sides (which are opposite to each other) of the display region, the connection portion 21 may be a continuous film; in the case where the first power line VDD and the second power line VSS are respectively disposed at both sides (which are opposite to each other) of the display region, the connection part 21 may include a plurality of connection lines.

Of course, the number of the connection lines 211 may be the same as the number of the pixels, and the driving transistors T1 are connected to the connection lines 211 in one-to-one correspondence.

As shown in FIG. 5, the connection portion 21 is provided between the driving transistor T1 and the substrate 30. An insulating layer 31 is arranged between the connection portion 21 and the active layer Active1 of the driving transistor T1, and the first electrode of the driving transistor T1 may be coupled to the connection portion 21 through a via penetrating through the insulating layer 31. When the first power line VDD is located in the display region, the first power line VDD and the connection portion 21 are provided in different layers, and the first power line VDD may be coupled to the connection portion 21 through a via. When the first power line VDD and the second power line VSS are arranged as shown in FIG. 4, the connection portion 21 may be coupled to the first power line VDD through a plurality of third signal lines 43.

The display substrate according to the embodiment of the present disclosure may further include a plurality of signal lines. As shown in FIG. 3, the second power line VSS may be connected to corresponding equivalent resistors through a plurality of first signal lines 41 and a plurality of second signal lines 42. As shown in FIG. 4, the first power line VDD is connected to corresponding additional resistors through a plurality of third signal lines 43, and the second power line VSS is connected to corresponding equivalent resistors through a plurality of fourth signal lines 44. The first power line VDD, the second power line VSS, the first signal lines 41, the second signal line 42, the third signal lines 43 and the fourth signal lines 44 may be made of opaque metal to reduce resistance. For example, the first power line VDD, the second power line VSS, the first signal line 41, the second signal line 42, the third signal line 43, and the fourth signal line 44 may be Ti/Al/Ti composition layers.

In addition, a buffer layer 32 is further disposed on the substrate 30, the connection portion 21 is provided on a side of the buffer layer 32 distal to the substrate 30, an interlayer dielectric layer 33 is further disposed between the first electrode S1 and the second electrode D1 of the driving transistor T1 and a gate G1 of the driving transistor T1, a planarization layer 34 is disposed between the first electrode 13 of the light emitting unit 10 and the second electrode D2 of the light emitting control transistor T2, and the first electrode 13 of the light emitting unit 10 is coupled to the second electrode D2 of the light emitting control transistor T2 through a via penetrating through the planarization layer 34. A pixel definition layer 35 is further disposed on the planarization layer 34, the pixel definition layer 35 having a plurality of pixel openings in which a light emitting layer 12 of the light emitting unit 10 is disposed.

In the embodiment of the present disclosure, the connection portion 21 is provided between the driving transistor T1 and the substrate 30, the connection portion 21 being coupled to the first power line VDD. The connection portion 21 may be a continuous film, and the first electrode S1 of the driving transistor T1 is coupled to the connection portion 21 through a via, and thus coupled to the first power line VDD through the connection portion 21. In addition, the first power line VDD is provided between the two second power lines VSS, or the first power line VDD and the second power line VSS are respectively provided at two opposite sides of the display region AA. Therefore, the farther from the second power line VSS, the greater the equivalent resistance (i.e., the second resistance of the second resistor R2) between the second electrode 11 of the light emitting unit 10 and the second power line VSS, and the smaller the additional resistance (i.e., the first resistance of the first resistor R1) between the first electrode 13 of the light emitting unit 10 and the first power line VDD, so as to ensure that in different pixels, resistances of circuit branches each provided with a light emitting unit are substantially the same, thereby improving the uniformity of the display luminance. The embodiment according to the present disclosure may be implemented easily by providing the connection portion 21 on the substrate 30, coupling the first electrode of the driving transistor T1 to the connection portion 21, and separating the first power line VDD from the second power line VSS.

Figure 6:
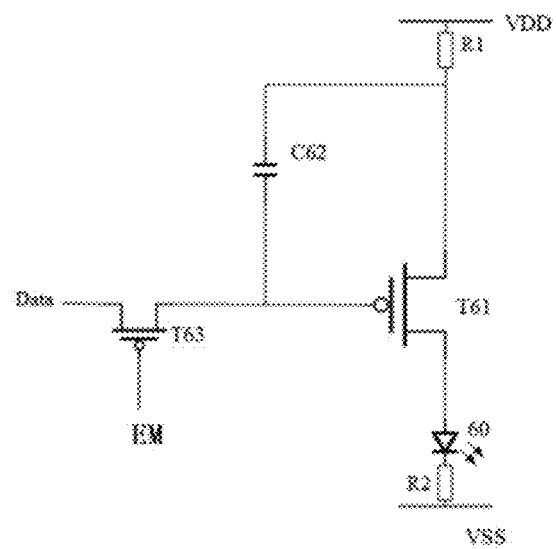
FIG. 6 is a schematic diagram of an equivalent circuit of each pixel according to an embodiment of the disclosure.

It should be noted that the equivalent circuit shown in FIG. 2 is merely illustrative and not intended to limit the present disclosure, and the present disclosure may be applied to any suitable circuit structure (e.g., 2T1C, 4T1C, 7T1C, etc) by one skilled in the art. Taking the 2T1C circuit which is commonly used in the art as an example, as shown in FIG. 6, there is an equivalent resistor (which may be regarded as the second resistor R2 with the second resistance) with an equivalent resistance between the cathode of the light emitting unit 60 and the second power line VSS, in the pixels in the same row, the longer the distance L from the light emitting unit 60 to the second power line VSS in the first direction substantially parallel to the row direction of the pixel array, the greater the equivalent resistance (i.e., the second resistance of the second resistor R2) between the cathode of the light emitting unit 60 and the second power line VSS. Therefore, according to an embodiment of the present application, a connection portion is provided between the anode of the light emitting unit 60 and the first power line VDD, the connection portion with the additional resistance may be regarded as the first resistor R1 with the first resistance. The connection portion is configured such that in the light emitting units 10 in the same row, the changing trend of the first resistance of the first resistor R1 with respect to the distance L is opposite to the changing trend of the second resistance of the second resistor R2 with respect to the distance L, such that difference in current received by the light emitting units in different pixels may be reduced, and a uniformity of display luminance may be improved. In addition, the 2T1C circuit according to the present disclosure may further include a driving transistor T61, a first electrode of the driving transistor T61 is coupled to the first power line VDD through the additional resistor (i.e., the first resistor R1), a gate of the driving transistor T61 is coupled to a first electrode of a second capacitor C62, a second electrode of the driving transistor T61 is coupled to the anode of the light emitting unit 60, the first electrode of a second capacitor C62 is also coupled to a first electrode of a third transistor T63, a second electrode of the second capacitor C62 is coupled to the first electrode of the driving transistor T61, a second electrode of a third transistor T63 is coupled to a data line Data, and a gate of the third transistor T63 is coupled to a light emitting control signal line EM.

It will be understood that the above embodiments are merely exemplary embodiments to illustrate the principles of the present disclosure, and the present disclosure is not limited thereto. It will be apparent to those skilled in the art that various changes and modifications can be made therein without departing from the spirit and scope of the disclosure, and these changes and modifications are to be considered within the scope of the present disclosure.

What is claimed is:

1. A display substrate, comprising
a substrate,
a first power line on the substrate,
a second power line, and
a plurality of pixel groups, wherein each of the plurality of pixel groups comprises a plurality of pixels arranged in a first direction, the plurality of pixel groups are arranged in a second direction parallel to an extending direction of the first power line, the second direction is different from and intersects with the first direction, each of the plurality of pixels comprises a light emitting unit having a first electrode and a second electrode, the first electrode of the light emitting unit is coupled to the first power line through an additional resistor with an additional resistance, and the second electrode of the light emitting unit is coupled to the second power line through an equivalent resistor with an equivalent resistance, wherein the plurality of pixels in a same pixel group have substantially a same sum of the equivalent resistance and the additional resistance;

wherein each of the plurality of pixels further comprises a pixel driving circuit for driving the light emitting unit to emit light, the pixel driving circuit comprises a driving transistor, and a first electrode of the driving transistor is coupled to the first power line through the additional resistor; and wherein the driving transistor is provided on the substrate, and the additional resistor or provided between the driving transistor and the substrate.

2. The display substrate of claim 1, wherein the pixel driving circuit further comprises a first capacitor and a light emitting control transistor, and a gate of the driving transistor is coupled to a first electrode of the first capacitor, a second electrode of the first capacitor is coupled to a data line, a second electrode of the driving transistor is coupled to a first electrode of the light emitting control transistor, a second electrode of the light emitting control transistor is coupled to the first electrode of the light emitting unit, and a gate of the light emitting control transistor is coupled to a light emitting control signal line.

3. The display substrate of claim 2, wherein the second power line comprises a first sub-power line and a second sub-power line respectively provided at both sides of each of the plurality of pixel groups.

4. The display substrate of claim 3, wherein the first power line is provided between the first sub-power line and the second sub-power line, and an orthographical projection of the first power line on the substrate is substantially located at a bisector of an orthographical projection of the plurality of pixel groups on the substrate.

5. The display substrate of claim 4, wherein the additional resistors of the plurality of pixels in the same pixel group are formed as a connection line continuously extending in the first direction.

6. The display substrate of claim 5, wherein in the same pixel group, the equivalent resistance increases while the additional resistance decreases as a distance between a pixel and the first power line becomes shorter.

7. The display substrate of claim 4, wherein the first sub-power line is coupled to corresponding equivalent resistors through a plurality of first signal lines, respectively; and the second sub-power line is coupled to corresponding equivalent resistors through a plurality of second signal lines, respectively.

8. The display substrate of claim 5, wherein the second electrodes of the light emitting units of all pixels of the plurality of pixel groups form a second electrode layer which is continuous, and a surface resistance of the connection line is the same as a surface resistance of the second electrode layer.

9. The display substrate of claim 5, wherein, among the plurality of pixel groups, the driving transistors in a same pixel group are coupled to a same connection line, and wherein the additional resistor is made of a transparent conductive material.

10. The display substrate of claim 7, wherein the plurality of first signal lines and the plurality of second signal lines are made of a light-opaque metal material.

11. The display substrate of claim 2, wherein the first power line is provided at one side of the plurality of pixel groups, and the second power line is provided at the other side, which is opposite to the one side, of the plurality of pixel groups.

12. The display substrate of claim 11, wherein the additional resistors of all pixels of the plurality of pixel groups are formed to have a planar-shaped structure which is continuous.

13. The display substrate of claim 12, wherein in a same pixel group, the equivalent resistance increases while the additional resistance decreases as a distance between a pixel and the first power line becomes shorter.

14. The display substrate of claim 12, wherein the driving transistor of each of the plurality of pixels is coupled to the planar-shaped structure.

15. The display substrate of claim 11, wherein the first power line is coupled to corresponding additional resistors through a plurality of third signal lines, respectively; and the second power line is coupled to corresponding equivalent resistors through a plurality of fourth signal lines, respectively.

16. The display substrate of claim 15, wherein the plurality of third signal lines and the plurality of fourth signal lines are made of a light-opaque metal material.

17. The display substrate of claim 2, further comprising an insulating layer disposed between the additional resistor and an active layer of the driving transistor, wherein the first electrode of the driving transistor penetrates through the insulating layer through a via hole therein to be in contact with the additional resistor.

18. The display substrate of claim 1, wherein the pixel driving circuit further comprises a second capacitor, and a third transistor, wherein, a second electrode of the driving transistor is coupled to a first electrode of the light emitting unit, a gate of the driving transistor is coupled to a first electrode of the second capacitor and a first electrode of the third transistor, a second electrode of the second capacitor is coupled to the first electrode of the driving transistor, a second electrode of the third transistor is coupled to a data line, and a gate of the third transistor is coupled to a light emitting control signal line.

19. A display device comprising the display substrate of claim 1.

* * * * *